United States Patent [19]

Avant

[11] 4,043,438
[45] Aug. 23, 1977

[54] PRINTING CONTROL CIRCUIT

[75] Inventor: Lester Avant, Northbrook, Ill.

[73] Assignee: Litton Business Systems, Inc., Morristown, N.J.

[21] Appl. No.: 680,848

[22] Filed: Apr. 27, 1976

[51] Int. Cl.[2] .......................................... H03K 17/74
[52] U.S. Cl. .................................. 197/1 R; 307/262; 307/269
[58] Field of Search ................... 197/1 R; 101/93.05, 101/93.06; 307/260, 262, 269, 235 R, 235 B, 235 J, 235 K, 293, 295, 208, 227; 331/17, 25

[56] References Cited

U.S. PATENT DOCUMENTS

| | | | |
|---|---|---|---|
| 3,308,387 | 3/1967 | Hackett | 307/262 X |
| 3,758,720 | 9/1973 | Dinn | 307/269 X |
| 3,772,600 | 11/1973 | Natali | 307/269 X |
| 3,792,361 | 2/1974 | Sordello et al. | 307/269 X |
| 3,896,388 | 7/1975 | Hatsukano et al. | 307/269 X |
| 3,919,647 | 11/1975 | Haas | 307/262 X |
| 3,930,203 | 12/1975 | Haas | 307/262 X |
| 3,973,212 | 8/1976 | Walloch | 307/262 X |
| 3,986,113 | 10/1976 | Vifian | 307/262 X |
| 3,990,559 | 11/1976 | Martin et al. | 101/93.05 X |
| 3,996,581 | 12/1976 | Brodeur et al. | 197/1 R X |

FOREIGN PATENT DOCUMENTS

| | | | |
|---|---|---|---|
| 790,179 | 6/1965 | Canada | 307/262 |

OTHER PUBLICATIONS

"Phase Detector for Self-Clocking Variable-Frequency Oscillators" IBM Tech. Discl. Bull. vol. 14, No. 7, Dec. 1971, p. 2171.
"Phase-Lock Loop with Constant Duty Cycle" IBM Tech. Discl. Bull. vol. 14 No. 6 Nov. 1971 pp. 1838-1839.
"Me Recovery Circuit with Two-Speed Phase Correction" IBM Tech. Discl. Bull. vol. 13, No. 9, Feb. 1971, pp. 2614-2615.

*Primary Examiner*—E. H. Eickholt
*Attorney, Agent, or Firm*—Robert F. Rotella; Norman Friedman

[57] ABSTRACT

A phase-locked loop circuit for use in a printer which automatically compensates for speed changes in the print head due to changes in line frequency to maintain consistent character width print impressions.

5 Claims, 1 Drawing Figure

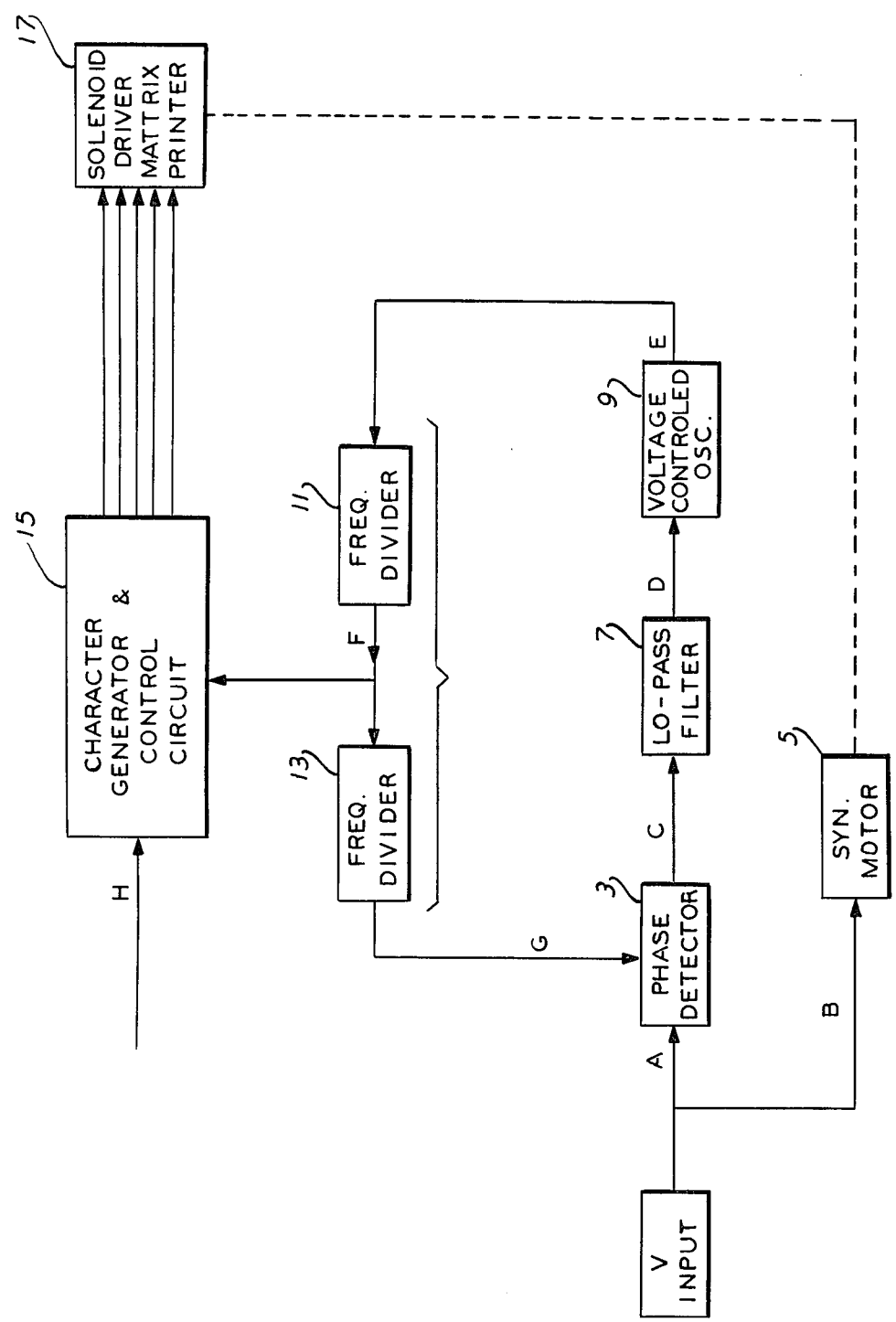

PRINTING CONTROL CIRCUIT

BACKGROUND OF THE INVENTION

Printing control circuits have been developed but these have shortcomings which affect their usefulness as regard accurate and consistent printing of characters. These devices have employed a light comb arrangement to determine the position of the printed output. In the case of a matrix type character print-out a synchronized pulsed light beam together with a fixed comb-like member having a plurality of apertures is utilized together with a photodetector on the print head to determine the actual position of said print head. Such output positional information is then utilized to control the speed of said print head in order to achieve consistent character printing. Magnetic output detection means have also been utilized to determine the actual position of the print head.

SUMMARY OF THE INVENTION

It is therefore, an object of this invention to provide an improved printing control circuit.

Another object of this invention is to provide a printing control circuit which achieves constant character width impressions on a print medium.

A further object of this invention is to provide a printing control circuit which automatically compensates for frequency change in the line voltage to provide printing of characters which are all of the same width.

A still further object of this invention is to provide a printing control circuit which can be utilized for either 50 or 60 Hz line operation without the necessity of changing motors or gear trains.

These and other objects of the present invention are accomplished in the illustrative embodiment by providing a phase-lock loop circuit which utilizes at least two frequency dividers. The phase-lock loop includes a phase detector which has as one of its inputs the standard line voltage at either 60 or 50Hz. This same voltage is supplied to a a.c. synchronous motor which horizontally drives a print head in a print carriage. The output of the phase detector is coupled to a voltage controlled oscillator through a low pass filter. The voltage output from the voltage controlled oscillator has its frequency divided down by a first frequency divider to provide a timing signal to a character generator and control circuit which has fed to it input data signals. Such character generator and control circuit in turn drive a matrix print head. This same output is further divided down in the loop by a second frequency divider whose output is coupled to said phase detector. This phase detector compares the input line voltages frequency and phase with the output voltage from said second frequency divider to generate any phase error therebetween, thereby automatically varying the frequency of the timing signals as a function of the frequency of the line voltage.

BRIEF DESCRIPTION OF THE DRAWING

The invention is illustrated by the sole FIGURE in the drawing which is a simplified functional block diagram of the circuit incorporating the features of this invention.

DESCRIPTION OF THE INVENTION

Referring to the sole FIGURE, which is a simplified functional block diagram of the invention, a voltage source 1, referred to as V-INPUT, which may be the line voltage, 120 volts a.c. at 60 Hz, is coupled over line A to one input of a phase detector circuit 3 as well as to the input of a a.c. synchronous motor 5, over line B. The output from the phase detector 3, is coupled over line C to the input of a low pass filter 7 whose output is coupled over line D to the input of a voltage controlled oscillator 9. The voltage controlled oscillator 9 provides a local reference signal, 30,000 Hz in the preferred embodiment, having a frequency which is variable over a range on either side of the nominal frequency of the component of the input signal to which the loop is to lock, preferably at 30,000 Hz. The output signal from the phase detector 3 is fed to a low pass filter 7 which eliminates all signal components except for the voltage controlled oscillator correction voltage. The phase detector 3 provides an output signal which is a function of the frequency and/or phase difference between its two inputs. The output of the voltage controlled oscillator 9 is coupled over line E to a frequency divider comprising a first frequency divider 11, which in the preferred embodiment provides a division by 50, and whose output F is coupled to a second frequency divider 13, which in the preferred embodiment provides a division by 10. The resulting output from the second frequency divider 13 is coupled over line G to the second input of said phase detector 3. The output from the first frequency divider 11 is also coupled over line F to the input of a character generator and control circuit 15 and provides timing signals of the appropriate frequency, in this embodiment 600 Hz at line F. The character generator and control circuit 15, converts the input data signals coupled over line H into output signals in a form suitable to energize an output printing device, in the preferred embodiment a conventional solenoid driven matrix printer 17, which is shown as a "5 high" matrix printer. This matrix printer 17 is conventionally mounted in the carriage mechanism of a printer unit (not shown) and is driven horizontally by the synchronous motor 5.

In operation if the input signal applied over line A is zero, or some value far from 60 Hz, such as 54 Hz, and the output frequency of the voltage controlled oscillator 9 is 30,000 Hz in the absence of any control voltage, then the error signal applied to the second input to the phase detector at line G will be 60 Hz. The phase error output over line C of the phase detector 3 will result in a 6 Hz phase error signal passed through the low pass filter 7 to the input of the voltage controlled oscillator 9. This error signal will tend to drive the voltage controlled oscillator 9 to 27,000 Hz. However, if the V input voltage is 60 Hz, but out of phase with the error signal over line G, the voltage at the output of the low pass filter will be a d.c. value of a magnitude proportional to the phase difference. Such voltage applied to the input of the voltage controlled oscillator 9 will tend to shift the oscillators frequency to thereby decrease the phase error reducing it toward zero whereby the voltage controlled oscillator will be phase-locked to the 60 Hz V-INPUT line voltage. If the frequency of the line voltage tends to change for any reason, an error signal will be developed in the loop to counteract the change. In both cases, where the frequency of the line voltage changes or where there is a difference in phase between the line voltage and the error signal, the frequency of the voltage controlled oscillator will vary as a function thereof thereby automatically producing timing signals whose frequency is proportionally changed. For example, if the line frequency increases the speed of the synchronous motor 5 and therefore the print head 7 will increase. At the same time the frequency of the timing signals applied to the character generator and control circuit 15 will increase thereby providing constant width printed characters.

In order to simply utilize said circuit in countries which have a 50 Hz line frequency it is only necessary to replace the first frequency divider 11 by one that divides by 60 instead of 50 while still providing the same 600 Hz timing signal. Such a system can be best utilized where there exists a similar whole number relationship between line frequency (50 or 60 Hz), controlled oscillator frequency, and desired frequency of timing pulses.

Obviously many modifications and variations of the present invention are possible in light of the above teachings. It is therefore, to be understood that within the scope of the appended claims the invention may be practiced otherwise than as specifically described.

What is claimed is:
1. A printing control circuit comprising:
   a means for transmitting line voltage,
   a phase-lock loop circuit, the input of which is coupled to said means for transmitting line voltage,
   printing means, coupled to the output of said phase-lock loop circuit, and
   motor means, coupled to said printing means and said means for transmitting line voltage, for moving said printing means,
   said phase-lock loop circuit including a first and second frequency divider means, the output of said phase-lock loop circuit being coupled from between said first and second frequency divider means.
2. The printing control circuit of claim 1 wherein said phase-lock loop circuit additionally comprises;
   a phase detector, having a first input coupled to said means for transmitting line voltage, and a second input, and an output,
   a low-pass filter whose input is coupled to the output of said phase detector,
   a voltage controlled oscillator having an input coupled to the output of said low-pass filter and an output coupled to said frequency divider means.
3. The printing control circuit of claim 2 wherein said first frequency divider means divides by 50 when the line frequency is 60 Hz.
4. The printing control circuit of claim 2 wherein said first frequency divider means divides by 60 when the line frequency is 50 Hz.
5. The printing control circuit of claim 2 wherein there is a whole number relationship between the frequency of the line voltage, controlled oscillator, and the output of said phase-lock loop circuit.

* * * * *